United States Patent [19]
Ballentine et al.

[11] Patent Number: 5,248,402
[45] Date of Patent: Sep. 28, 1993

[54] APPLE-SHAPED MAGNETRON FOR SPUTTERING SYSTEM

[75] Inventors: Paul H. Ballentine; Dorian Heimanson; Alan T. Stephens, II, all of Rochester, N.Y.

[73] Assignee: CVC Products, Inc., Rochester, N.Y.

[21] Appl. No.: 921,912

[22] Filed: Jul. 29, 1992

[51] Int. Cl.⁵ .......................................... C23C 14/35
[52] U.S. Cl. .............................. 204/298.2; 204/192.12
[58] Field of Search ........................ 204/298.2, 192.12

[56] References Cited

U.S. PATENT DOCUMENTS

| | | | |
|---|---|---|---|
| 4,166,018 | 8/1979 | Chapin | 204/192.12 |
| 4,746,417 | 5/1988 | Ferenbach et al. | 204/298.2 |
| 4,872,964 | 10/1989 | Suzuki et al. | 204/298.2 |
| 4,995,958 | 2/1991 | Anderson et al. | 204/298.2 |
| 5,047,130 | 9/1991 | Akao et al. | 204/192.12 |
| 5,130,005 | 7/1992 | Hurwitt et al. | 204/192.12 |
| 5,164,063 | 11/1992 | Braeuer et al. | 204/298.2 |
| 5,171,415 | 12/1992 | Miller et al. | 204/298.09 |
| 5,182,003 | 1/1993 | Maass et al. | 204/298.23 |
| 5,188,717 | 2/1993 | Broadbent et al. | 204/192.12 |
| 5,194,131 | 3/1993 | Anderson | 204/192.12 |

FOREIGN PATENT DOCUMENTS

| | | | |
|---|---|---|---|
| 0439360 | 7/1991 | European Pat. Off. | 204/298.2 |
| 0439361 | 7/1991 | European Pat. Off. | 204/298.2 |

*Primary Examiner*—Aaron Weisstuch
*Attorney, Agent, or Firm*—Eugene Stephens & Associates

[57] ABSTRACT

A sputtering system magnetron formed of an array of permanent magnets rotated in proximity to a plane of a target disposed in a vacuum chamber has an improved shape resembling a cross section of an apple. The magnetic path established between oppositely poled pairs of magnets is inturned in a stem region proximate to the axis of rotation for the array and has a pair of opposed lobes extending outward from the stem region in a generally semi-circular form. The lobes lead to and join each other in an indent region opposite the stem region. The maximum distance across the path between the lobes is about double the minimum distance across the path between the stem region and the indent region.

25 Claims, 1 Drawing Sheet

APPLE-SHAPED MAGNETRON FOR SPUTTERING SYSTEM

FIELD OF THE INVENTION

This invention involves the shape of a permanent magnet array that is rotated proximate to a target in a magnetron sputtering system.

BACKGROUND OF THE INVENTION

Magnetron sputtering systems, such as suggested in U.S. Pat. No. 4,166,018, have used rotatable arrays of permanent magnets arranged in polar pairs in generally heart-shaped configurations, as suggested by U.S. Pat. Nos. 4,872,964 and 4,995,958, to form a generally heart-shaped magnetic path proximate to a target that is eroded by sputtering. Uniform erosion of the target has been emphasized, partly for target erosion purposes and partly to ensure that a coating is applied uniformly on a surface of a substrate. Prior art magnetrons of this type have generally settled on heart-shaped configurations for the permanent magnet arrays and the resulting magnetic paths, as an optimum configuration to enhance uniformity of the sputtering process.

We have discovered, however, that conventionally shaped magnetrons produce substrate coatings whose uniformity is less than optimum. In seeking to remedy this, we have discovered that an improved magnetron shape, departing from the conventional heart shape, produces a substrate coating that is substantially more uniform.

SUMMARY OF THE INVENTION

Our invention aims at more uniformly thin films deposited on a substrate in a sputtering process and accomplishes this by using a magnetron formed of an array of permanent magnets arranged in polar pairs in an apple shape, rather than a heart shape. Our apple shape for the magnetic path extending between polar pairs of permanent magnets in a magnetron array resembles a cross section through an apple, with the magnetic path being inturned in a stem region and indented in a region opposite the stem region. A pair of opposed lobes extend from the stem region to the indent region, and the lobes are generally semi-circular in shape. The stem region of our apple-shaped magnetron is proximate to the center of rotation for the magnet array, and the maximum distance across the magnetic path between the lobes is about double the minimum distance across the path between the indentation or indent region.

We have found that our apple-shaped magnetron produces substantially more uniform coatings on substrates and also ensures that erosion occurs over the entire surface of the target so that the target is kept clean during the sputtering process. This is important to avoid buildup on the target of particles that can contaminate the substrate and cause imperfections in coating uniformity.

DETAILED DESCRIPTION

Figure 1:
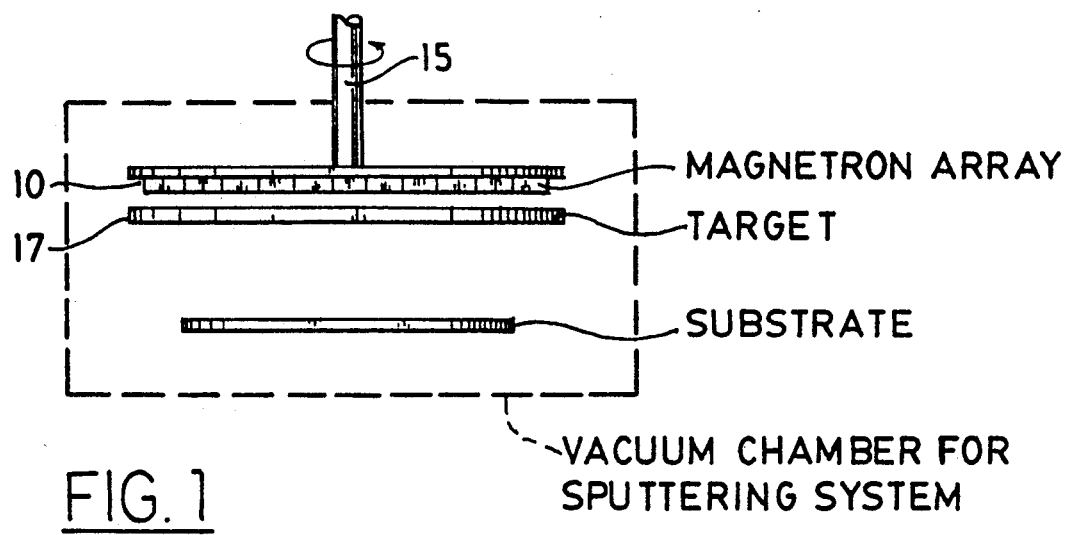
FIG. 1 is a schematic view of a sputtering system having a vacuum chamber within which a target, a substrate, and a magnetron array according to our invention are arranged.
Figure 2:
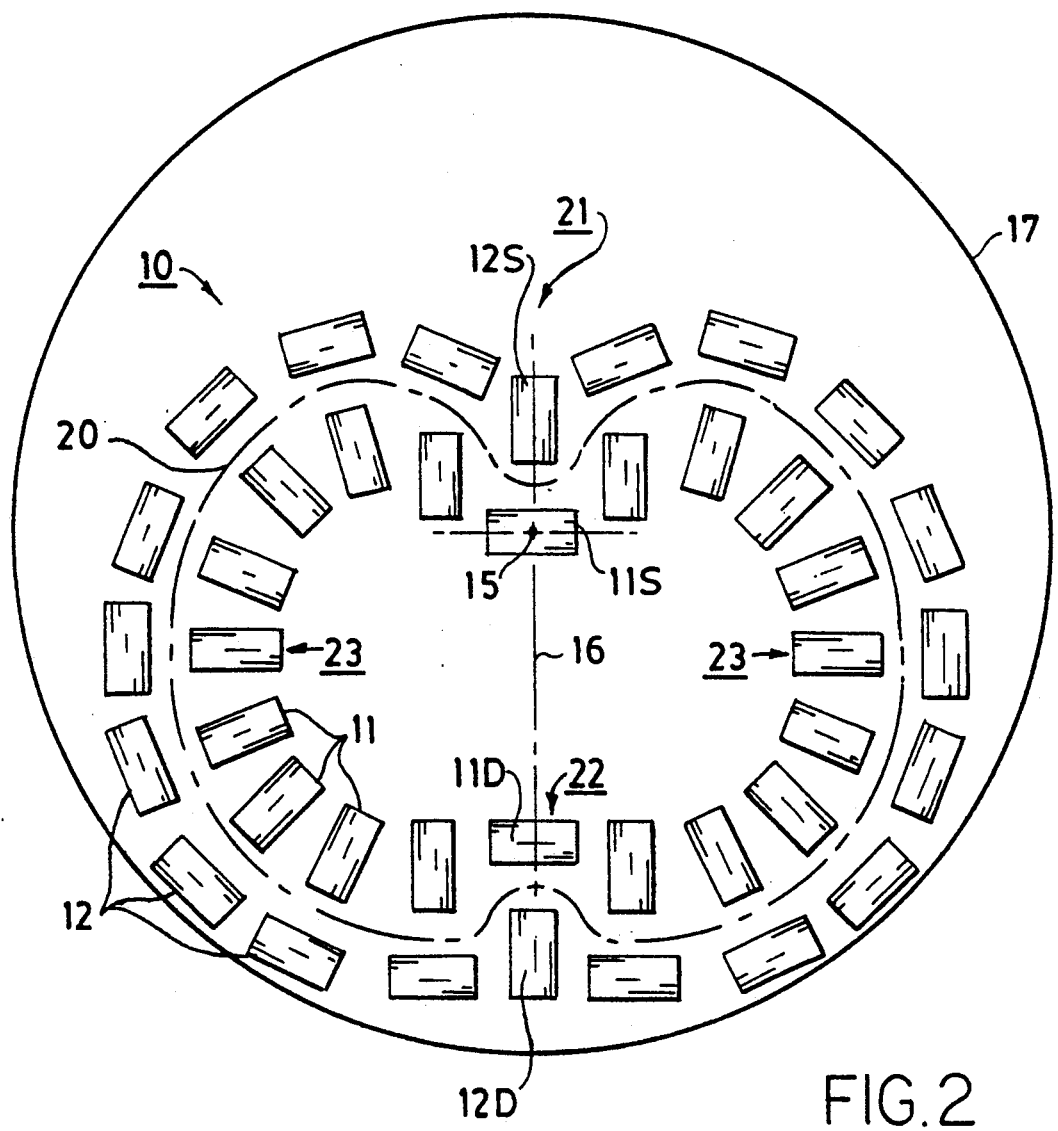
FIG. 2 shows a preferred configuration of permanent magnet pairs of a magnetron having an apple shape according to our invention.

The sputtering system in which our magnetron works is schematically shown in FIG. 1. The art of sputtering systems is well understood, and more information is available in the above-cited patents. The sputtering process occurs in a vacuum chamber containing a target of material to be sputtered onto a substrate, which receives a coating of a film of material deposited from the target. The substrate is often a wafer on which microelectronic components are fabricated, but it can also be an optical element or other structure having a surface to be coated. The magnetron portion of the sputtering system consists of a rotatable array 10 of permanent magnets arranged proximate to and parallel with a target 17, where the array is revolved around a rotational axis 15. Our invention involves the shape of magnetic array 10, a preferred embodiment of which is shown in FIG. 2.

Array 10 is preferably formed of pairs of oppositely poled magnets arranged to straddle or lie on opposite sides of a magnetic path 20, shown as a dashed and dotted line. The path 20 is apple shaped in the sense of resembling a cross section through an apple having a stem region 21, an indentation or indent region 22 opposite stem region 21, and a pair of generally semi-circular lobes 23 extending from stem region 21 to indent region 22. The resulting shape of path 20 is somewhat more squat and broad than the cross section of a typical apple, but the resemblance remains apt because of the relatively sharp inturn of path 20 at stem region 21 and the relatively shallower inturn of path 20 at indentation 22, opposite stem region 21.

Magnetic path 20 in stem region 21 is proximate to rotational axis 15, and lobes 23 extend away from axis 15 and are opposed to each other on opposite sides of a center line 16 bisecting path 20 through stem region 21 and indent region 22. Lobes 23 depart somewhat from semi-circularity in being more sharply curved near the inturn at stem region 21 than near the indentation at region 22. A maximum distance across path 20 between lobes 23 is about double a minimum distance across path 20 between stem region 21 and indent region 22.

The oppositely poled pairs of permanent magnets arranged to straddle path 20 include inner magnets 11 and outer magnets 12. The polarities of magnets 11 and 12 are opposite, as are their respective positions on opposite sides of path 20. Magnets 11 and 12 are preferably oblong in shape and are generally rectangular as shown in the preferred embodiment of FIG. 2. They are held in place for rotation by fasteners, adhesive, or molded resin material.

Except in stem region 21 and indent region 22, outer magnets 12 are arranged tangentially of path 20 and inner magnets 11 are arranged radially of path 20. This relationship is preferably reversed in stem region 21 and indent region 22. An outer magnet 12S in stem region 21 is arranged radially of path 20, and an inner magnet 11S is arranged tangentially of path 20 in stem region 21. Inner magnet 11S is also preferably positioned on rotational axis 15 to ensure that path 20 is proximate to axis 15 in stem region 21. Inner magnet 11S is also arranged inwardly of the adjacent inner magnets on opposite sides of magnet 11S to accommodate the deeply inturned form of path 20 in stem region 21.

In indent region 22, an inner magnet 11D is tangential to path 20 and an outer magnet 12D is radial to path 20. Since the inturning of path 20 in indent region 22 is less than its inturn in stem region 21, inner magnet 11D is arranged even with the adjacent inner magnets 11.

Our apple-shaped magnetron is preferably sized and positioned relative to the target material so that erosion occurs over the entire erodable surface of target 17 to ensure that the target is kept clean during the sputtering process. Any uneroded target surface provides a place for particles of target material to collect, and this is undesirable since particles may migrate to the substrate and contaminate the thin film coating deposited on its surface. Full target surface erosion is assured by the extent of the sweep of the magnetron array over the full target area, in combination with the gap between the magnetron and the erodable surface of the target and the power being applied.

Our apple-shaped magnetron causes enhanced erosion of the target material around the perimeter of the erodable surface of the target. This is necessary to ensure uniform deposition of a thin film coating on a substrate from a somewhat larger target. Our emphasis is on uniformity of the substrate coating, though, rather than the erosion profile of the target face.

The improved results we have obtained with our apple-shaped magnetron 10 involve substantially better uniformity in the thin film coatings deposited in a sputtering process using our improved magnetron. Our work with several variations of heart-shaped magnet arrays for magnetrons, such as suggested in U.S. Pat. Nos. 4,872,964 and 4,995,958, produced films on 8 inch substrates having departures from uniformity ranging from 14.61 percent to 9.17 percent at a standard deviation or confidence level of 1 sigma. After changing to our improved apple shape, we attained more uniform coatings (again using 8 inch wafers for test purposes). The best departure from uniformity that we have obtained to date is 1.16 percent at a confidence level of 1 sigma, and our average departure from uniformity for approximately 1500 coatings on 8 inch wafers over the lifetime of a target is 1.66 percent at 1 sigma (4.98 percent at 3 sigma).

These uniformities substantially improve on the ones achieved using conventional heart-shaped magnetrons, as suggested by the prior art. Improved uniformity of coatings is also highly desirable for most coating purposes.

We claim:

1. In a sputtering system having a magnetron formed of an array of permanent magnets rotated in proximity to a plane target disposed in a vacuum chamber, the improvement comprising:
   a. said array being arranged to form a magnetic path that is generally apple shaped with a center of rotation for said array being proximate to a stem region of said apple shape;
   b. said path having an opposed pair of approximately semi-circular lobes extending from said stem region; and
   c. said path having an indentation joining said lobes opposite said stem region.

2. The improvement of claim 1 wherein said array is formed of generally oblong permanent magnets arranged in polar pairs with an outer magnet of each pair being arranged tangentially to said path and an inner magnet of each pair being arranged radially of said path except in said stem region and in said indentation where an outer one of said magnets is arranged radially of said path and an inner one of said magnets is arranged tangentially of said path.

3. The improvement of claim 2 wherein said inner one of said magnets in said stem region is arranged radially inward of adjacent inner magnets.

4. The improvement of claim 2 wherein said inner one of said magnets in said stem region is arranged on said center of rotation.

5. The improvement of claim 2 wherein said inner one of said magnets in said indentation is radially even with adjacent inner magnets.

6. The improvement of claim 1 wherein said array is configured relative to said target so that erosion occurs on all regions of said target to keep said target clean during sputtering.

7. The improvement of claim 1 wherein a maximum distance across said path between said lobes is about double a minimum distance across said path between said stem region and said indentation.

8. An improved shape for a magnetic path formed by an array of oppositely poled pairs of permanent magnets rotatably arranged in a plane parallel with a target in a sputtering system comprising:
   a. said path resembling a cross section of an apple having a center line extending through a stem region and an indent region opposite said stem region;
   b. said path being inturned in said stem region to a position proximate to an axis of rotation for said array;
   c. a pair of opposed lobes of said path extending from said stem region to said indent region on opposite sides of said center line, said lobes being approximately semi-circular in shape; and
   d. said path in said indent region being inturned less than in said stem region.

9. The magnetic path of claim 8 wherein said permanent magnets are generally oblong and are arranged with an outer magnet of each pair being tangential to said path and an inner one of each pair being radial of said path except in said stem region and in said indent region where an outer one of said magnets is radial of said path and an inner one of said magnets is tangential of said path.

10. The magnetic path of claim 9 wherein said inner one of said magnets in said stem region is arranged on said center of rotation.

11. The magnetic path of claim 9 wherein said inner one of said magnets in said stem region is arranged radially inward of adjacent inner magnets.

12. The magnetic path of claim 11 Wherein said inner one of said magnets in said indent region is radially even with adjacent inner magnets.

13. The magnetic path of claim 8 wherein said array is configured relative to said target so that erosion occurs on all regions of said target to keep said target clean during sputtering.

14. The magnetic path of claim 8 wherein a maximum distance across said path between said lobes is about double a minimum distance across said path between said stem region and said indent region.

15. The magnetic path of claim 14 wherein said array is configured relative to said target so that erosion occurs on all regions of said target to keep said target clean during sputtering.

16. A rotatable permanent magnet array for a magnetron, said array being arranged in a plane parallel with and proximate to a target in a sputtering system, said array comprising:

a. oppositely poled pairs of said permanent magnets being arranged on opposite sides of a magnetic path extending in a pair of opposed symmetric lobes leading away from the region of a rotational axis for said array;

b. said symmetric lobes being shaped like a cross section of an apple and being inturned to meet in a stem region proximate to said rotational axis;

c. each of said lobes being approximately semi-circular from said stem region to an indent region opposite said stem region; and d. said path in said indent region being curved inward by less than the inturn of said lobes at said stem region.

17. The array of claim 16 wherein a maximum distance across said path between said lobes is about double a minimum distance across said path between said stem region and said indent region.

18. The array of claim 17 wherein said magnets are generally oblong with an outer magnet of each pair being arranged tangentially to said lobes and an inner magnet of each pair being arranged radially of said lobes.

19. The array of claim 18 wherein said stem region and said indent region have a outer one of said magnets arranged radially of said path and an inner one of said magnets arranged tangentially of said path.

20. The array of claim 19 wherein said inner one of said magnets in said stem region is arranged radially inward of adjacent inner magnets.

21. The array of claim 19 wherein said inner one of said magnets in said stem region is arranged on said center of rotation.

22. The array of claim 19 wherein said inner one of said magnets in said indentation is radially even with adjacent inner magnets.

23. The array of claim 16 wherein said array is configured relative to said target so that erosion occurs on all regions of said target to keep said target clean during sputtering.

24. The array of claim 23 wherein a maximum distance across said path between said lobes is about double a minimum distance across said path between said stem region and said indent region.

25. The array of claim 24 wherein said magnets are generally oblong with an outer magnet of each pair being arranged tangentially to said lobes and an inner magnet of each pair being arranged radially of said lobes.

* * * * *